US009520520B2

(12) United States Patent
Lin et al.

(10) Patent No.: US 9,520,520 B2
(45) Date of Patent: Dec. 13, 2016

(54) FOCUSING SOLAR LIGHT GUIDE MODULE

(71) Applicant: INDUSTRIAL TECHNOLOGY RESEARCH INSTITUTE, Hsinchu (TW)

(72) Inventors: Hui-Hsiung Lin, Miaoli County (TW); Chun-Ting Lin, New Taipei (TW); Yu-Nan Pao, Hsinchu (TW); Chin-Ju Hsu, Tainan (TW); Jen-Hui Tsai, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 237 days.

(21) Appl. No.: 13/730,326

(22) Filed: Dec. 28, 2012

(65) Prior Publication Data

US 2013/0160820 A1  Jun. 27, 2013
US 2016/0155875 A9  Jun. 2, 2016

Related U.S. Application Data

(63) Continuation of application No. PCT/CN2011/084529, filed on Dec. 23, 2011.

(30) Foreign Application Priority Data

Dec. 30, 2010  (CN) .......................... 2010 1 0622754
Dec. 20, 2011  (CN) .......................... 2011 1 0429223

(51) Int. Cl.
*H01L 31/0525*  (2014.01)
*H01L 31/052*  (2014.01)
(Continued)

(52) U.S. Cl.
CPC ....... *H01L 31/0525* (2013.01); *H01L 31/0543* (2014.12); *H01L 31/0547* (2014.12); *G02B 6/0038* (2013.01); *Y02E 10/52* (2013.01)

(58) Field of Classification Search
CPC ............. H01L 31/0525; H01L 31/0543; H01L 31/0547; F24J 2/10; F24J 2/06; F24J 2/18; F24J 2/08; G02B 6/0038; G02B 6/005
(Continued)

(56) References Cited

U.S. PATENT DOCUMENTS 7,664,350 B2  2/2010  Ghosh et al.
7,672,549 B2  3/2010  Ghosh et al.
(Continued)

FOREIGN PATENT DOCUMENTS

CA  WO 2011153633 A1 *  12/2011  ....... H01L 31/02327
CN  2606310 Y  3/2004
(Continued)

OTHER PUBLICATIONS

State Intellectual Property Office of the People's Republic of China, "Office Action", Aug. 5, 2013, China.
(Continued)

*Primary Examiner* — Matthew Martin
*Assistant Examiner* — Tae-Sik Kang
(74) *Attorney, Agent, or Firm* — Locke Lord LLP; Tim Tingkang Xia, Esq.

(57) ABSTRACT

A focusing solar light guide module includes a lens array plate and a light guide plate. The lens array plate includes at least one lens. Each lens receiving and focusing a sunlight has an upper curved surface and a lower plane surface. The light guide plate has an upper plane surface parallel to the lower plane surface of the lens array plate and a lower microstructure surface. The lower microstructure surface includes at least one depressed area and at least one connection area parallel to the upper plane surface of the light guide plate. The connection area is connected between the
(Continued)

adjacent depressed areas having a depressed point, a first inclined plane and a second inclined plane. The first inclined plane and the second inclined plane are respectively connected between the depressed point and the adjacent connection area.

2 Claims, 16 Drawing Sheets

(51) Int. Cl.
*H01L 31/054* (2014.01)
*F21V 8/00* (2006.01)

(58) Field of Classification Search
USPC .................. 136/246; 359/853, 464, 731
See application file for complete search history.

(56) References Cited

U.S. PATENT DOCUMENTS

| | | | |
|---|---|---|---|
| 2008/0271776 A1* | 11/2008 | Morgan | ........................ 136/246 |
| 2009/0064993 A1 | 3/2009 | Ghosh et al. | |
| 2009/0067784 A1 | 3/2009 | Ghosh et al. | |
| 2010/0032005 A1 | 2/2010 | Ford et al. | |
| 2010/0116319 A1 | 5/2010 | Martinez Anton et al. | |
| 2010/0116336 A1 | 5/2010 | Martinez Anton et al. | |
| 2010/0278480 A1* | 11/2010 | Vasylyev | ........................ 385/33 |
| 2012/0140352 A1* | 6/2012 | Morgan | .............. H01L 31/0525 359/853 |

FOREIGN PATENT DOCUMENTS

| | | |
|---|---|---|
| CN | 101740652 A | 6/2010 |
| CN | 101904016 A | 12/2010 |
| EP | 2061092 A1 * | 5/2009 |
| KR | 100933213 B1 | 12/2009 |
| WO | 2010/033859 A2 | 3/2010 |
| WO | 2010124028 A2 | 10/2010 |
| WO | 2010/151253 A1 | 12/2010 |
| WO | 2010151253 A1 | 12/2010 |
| WO | 2010151254 A1 | 12/2010 |

OTHER PUBLICATIONS

State Intellectual Property Office of the People's Republic of China, "Office Action", China, Sep. 19, 2014.
Karp, Jason H. et al., Planar micro-optic solar concentrator, Optics Express 1122, Jan. 18, 2010, vol. 18, No. 2.
Rumyantsev, Valery D., Solar concentrator modules with silicone-on-glass Fresnel lens panels and multijunction cells, Optics Express A17, Apr. 26, 2010, vol. 18, No. S1.
Currie, Michael J. et al., High-Efficiency Organic Solar Concentrators for Photovoltaics, Science 321, 2008, vol. 226.
European Patent Office, "Office Action", Mar. 24, 2015, Germany.

* cited by examiner

FOCUSING SOLAR LIGHT GUIDE MODULE

CROSS-REFERENCE TO RELATED APPLICATIONS

This application is a continuation application of International Patent Application No. PCT/CN2011/084529 filed Dec. 23, 2011, entitled "FOCUSING-TYPE SOLAR LIGHT GUIDE MODULE", by Hui-Hsiung Lin et al., which itself claims the priority to Chinese Patent Application No. 201010622754.2, filed Dec. 30, 2010 and Chinese Patent Application No. 201110429223.6, filed Dec. 20, 2011, the disclosures for which are hereby incorporated herein in their entireties by reference.

TECHNICAL FIELD

The present disclosure relates to a focusing solar light guide module, and more particularly to a focusing solar light guide module with a light guide plate of a microstructure design.

BACKGROUND

With the rapid development of the industry, the problems of gradual exhaustion of fossil fuels and greenhouse gas emission are increasingly concerned around the world, and stable supply of energy resources apparently becomes a worldwide major topic. Compared with conventional coal-fired, gas-fired, or nuclear power generation, a solar cell directly converts solar energy into electric energy by a photoelectric or thermoelectric conversion effect without producing following greenhouse gases or polluting gases, such as carbon dioxide, nitrogen oxides, and sulfur oxides, thereby reducing dependence on fossil fuels, and providing a safe and independent power source.

In many solar cell technologies, radiant light of the sun converted by a solar cell material becomes a usable power source. Taking a crystalline silicon solar cell as an example, the crystalline silicon solar cell has photoelectric conversion efficiency of 12% to 20%, and the solar cells designed with different crystal materials have different photoelectric characteristics. Generally, the conversion efficiency of monocrystalline silicon or polycrystalline solar cells is approximately 14% or 16%, so duration of service is longer, but the power generation cost of the monocrystalline silicon or the polycrystalline solar cells is high. Therefore, subsidies from government are needed and this kind of solar cells are only applicable to power plants or traffic light signals.

In addition, besides the above silicon materials, the solar cells may further be made of other materials, for example, III-V compound semiconductor materials such as Indium Gallium Arsenide (InGaAs) and Gallium Arsenide (GaAs). Different from the crystalline silicon solar energy technology, the solar cells made of the III-V compound semiconductor material can absorb energy of wider solar spectrum, thus achieving the highest photoelectric conversion efficiency up to almost above 60% to 70%.

However, the manufacturing cost and the price of the solar cell made of III-V compound semiconductor material are also the highest among all kinds of solar cells. Therefore, in order to decrease a use of the solar cells and reduce power generation cost, a solar collector is equipped to reduce a light absorption area. However, the cost is compensated only when the solar collectors are required to be installed in a large area, thus incurring application inconvenience, and limiting application of the solar cells. Therefore, how to effectively reduce the power generation cost of the solar cell is actually one major topic people skilled in the art eagerly are required to solve currently.

SUMMARY

The present disclosure relates to a focusing solar light guide module, which is suitable to guide sunlight to an energy conversion device.

The focusing solar light guide module comprises a lens array plate and a light guide plate. The lens array plate comprises at least one lens, and each of the lenses has an upper curved surface and a lower plane surface. The lens array plate receives and focuses the sunlight. The light guide plate has an upper plane surface and a lower microstructure surface. The upper plane surface of the light guide plate is configured to be parallel to the lower plane surface of the lens array plate. The lower microstructure surface of the light guide plate comprises at least one depressed area and at least one connection area. The connection area is parallel to the upper plane surface of the light guide plate and is connected between the adjacent depressed areas. The depressed area comprises a depressed point, a first inclined plane, and a second inclined plane. The first inclined plane and the second inclined plane are located on the different sides of the depressed point, and are connected between the depressed point and the adjacent connection area thereof. After being focused by the lens array plate, the sunlight is reflected twice by the depressed area and the connection area in sequence, and is guided into the light guide plate by the total internal reflection. The sunlight passes through at least one side surface of the light guide plate. The energy conversion device is disposed on or near the side surface of the light guide plate to receive the sunlight passing through the side surface of the light guide plate, and convert the sunlight into an electric power.

The present disclosure further relates to a focusing solar light guide module, which is suitable to guide a sunlight to an energy conversion device in another manner.

The focusing solar light guide module comprises a light guide plate and a lens array plate. The light guide plate has an upper microstructure surface and a lower plane surface. The upper microstructure surface comprises at least one depressed area and at least one connection area. The connection area is parallel to the lower plane surface of the light guide plate and is connected between the adjacent depressed areas. The depressed area comprises a depressed point, a first inclined plate, and a second inclined plane. The first inclined plane and the second inclined plane are located on the different sides of the depressed point, and are connected between the depressed point and the adjacent connection area thereof. The lens array plate comprises at least one lens, and each of the lenses has an upper plane surface and a lower curved surface. The upper plane surface of the lens is configured to be parallel to the lower plane surface of the light guide plate. After passing through the light guide plate and reflected by the lower curved surface, the sunlight is reflected twice by the depressed area and the connection area of the upper microstructure surface of the light guide plate in sequence and is guided into the light guide plate by the total internal reflection, and the sunlight passes through at least one side surface of the light guide plate. The energy conversion device is disposed on or near the side surface of the light guide plate to receive the sunlight passing through the side surface of the light guide plate, and convert the sunlight into an electric power.

The present disclosure further relates to a focusing solar light guide module, which is suitable to guide a sunlight to an energy conversion device in another manner.

The focusing solar light guide module comprises a lens light guide plate. The lens light guide plate has a lens array and a plurality of microstructures. The lens array is disposed on a surface of the lens light guide plate and the microstructures are disposed on another opposite surface of the lens light guide plate. The lens array comprises at least one lens having a curved surface. The lens array receives and focuses the sunlight. The microstructures comprise at least one depressed area and at least one connection area. The connection area is connected between each of the at least one depressed part. The depressed area comprises a depressed point, a first inclined plane, and a second inclined plane. The first inclined plane and the second inclined plane are respectively disposed on two different sides of the depressed point, and are respectively connected between the depressed point and the adjacent connection area thereof. After the sunlight is focused by the lens light guide plate, the sunlight is reflected twice by the depressed area and the connection area of the microstructures of the lens light guide plate in sequence and is guided into the light guide plate by the total internal reflection, and the sunlight passes through at least one side surface of the lens light guide plate. The energy conversion device is disposed on or near the side surface of the lens light guide plate to receive the sunlight passing through the lens light guide plate, and converting the sunlight into an electric power source.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Figure 1A:
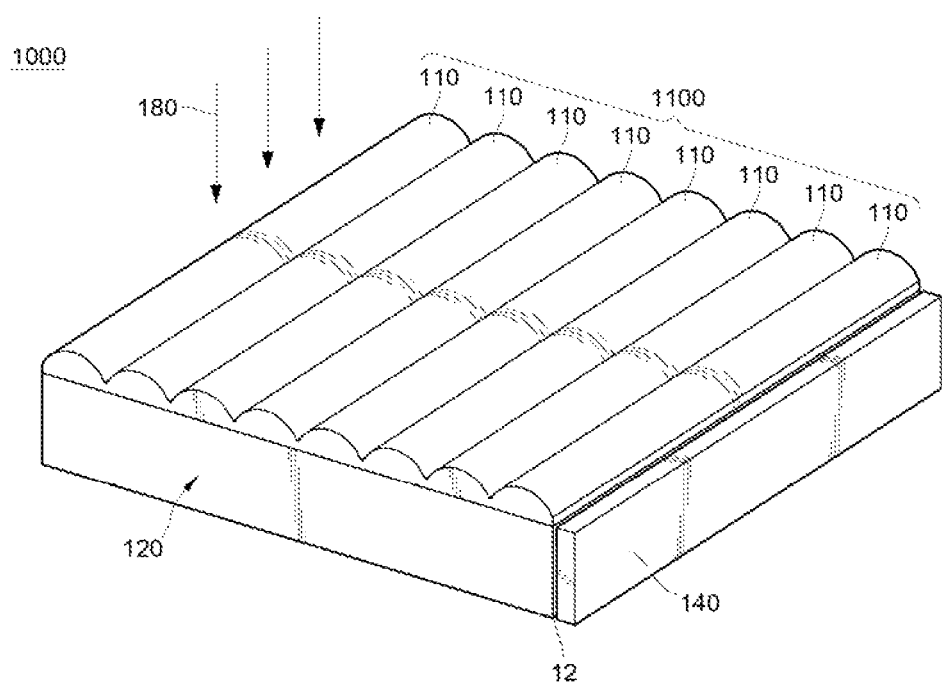
FIG. 1A is a schematic view of a focusing solar light guide module according to a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
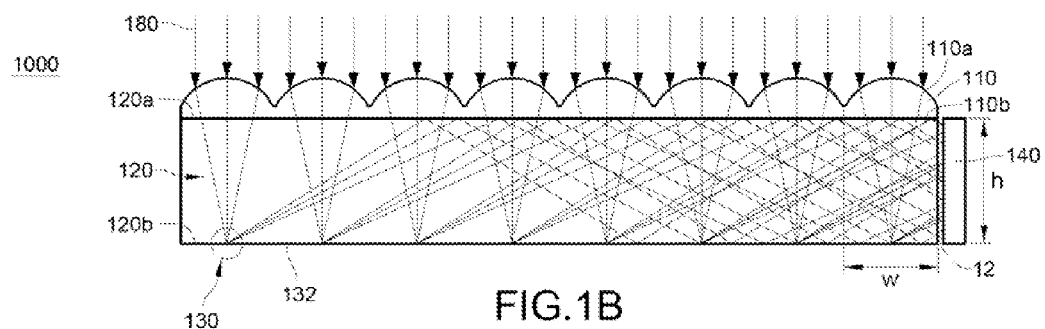
FIG. 1B is a side view according to FIG. 1A.
Figure 1C:
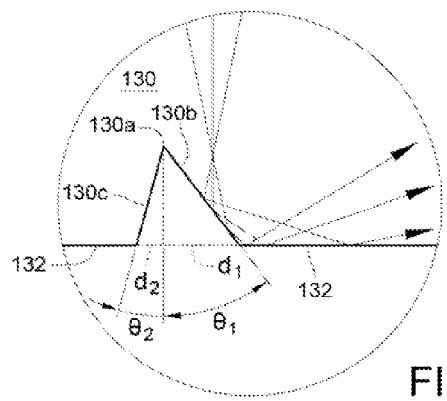
FIG. 1C is a partially enlarged view according to FIG. 1B.

FIG. 1A is a schematic view of a focusing solar light guide module according to a first embodiment. FIG. 1B is a side view according to FIG. 1A. FIG. 1C is a partially enlarged view according to FIG. 1B. Please refer to FIGS. 1A to 1C for the following descriptions.

First Embodiment

A focusing solar light guide module 1000 comprises a lens array plate 1100 and a light guide plate 120. An energy conversion device 140 is disposed on or near a first side surface 12 of the light guide plate 120. The energy conversion device 140 may be, but not limited to, a photoelectric conversion device or a thermoelectric conversion device. The focusing solar light guide module 1000 is suitable to guide sunlight 180 to the energy conversion device 140 for photoelectric or thermoelectric conversion, and the sunlight 180 is regarded as ideal parallel light.

The lens array plate 1100 receives and focuses the sunlight 180. The lens array plate 1100 comprises at least one lens 110, and each of the lenses 110 has an upper curved surface 110a and a lower plane surface 110b. For example, the lens array plate 1100 may be, but not limited to, a lenticular lens array film made by using a Roll-to-Roll (R2R) process. The lower plane surface 110b of the lens 110 is defined to have a radial distance between two endpoints of the upper curved surface 110a. The length of the lower plane surface 110b of the single lens 110 is W. In one embodiment, each of the lenses 110 is a hemisphere cylindrical lens. The upper curved surfaces 110a are connected to each other and the lower plane surfaces 110b are connected to each other. The lenses 110 are aligned in parallel to form the lens array plate 1100.

The light guide plate 120 has an upper plane surface 120a and a lower microstructure surface 120b. A thickness h of the light guide plate 120 is the distance between the upper plane surface 120a and the lower microstructure surface 120b. The upper plane surface 120a of the light guide plate 120 is configured to be parallel to the lower plane surface 110b of the lens 110. In the focusing solar light guide module according to the first embodiment of the present disclosure, the following description is based on that the upper plane surface 120a of the light guide plate 120 is parallel to, and in tight contact with the lower plane surface 110b of the lens 110. However, in other embodiments, the upper plane surface 120a of the light guide plate 120 may also have a gap away from, and parallel to the lower plane surface 110b of the lens 110. A connection relation between the upper plane surface 120a of the light guide plate 120 and the lower plane surface 110b of the lens 110 is not intended to limit the scope of the present disclosure.

The lower microstructure surface 120b comprises at least one depressed area 130 and at least one connection area 132. The connection area 132 is parallel to the upper plane surface 120a of the light guide plate 120, and the connection area 132 is connected between the adjacent depressed areas 130. That is to say, in the focusing solar light guide module according to the first embodiment of the present disclosure, the depressed areas 130 are separated from each other (namely, discontinuous), and are disposed on the lower microstructure surface 120b. Every two depressed areas 130 are separated from each other by a connection area 132. Thus, the lower microstructure surface 120b of the light guide plate 120 has the discontinuous depressed areas 130. In one embodiment, the position of each depressed area 130 is related to the position of one upper curved surface 110a of the lens 110. As a result, corresponding to the structure of the hemisphere cylindrical lens 110, the depressed area 130 is configured as a stripe structure. Specifically, the included angle between the axial direction of the hemisphere cylindrical lens 110 and the axial direction of the depressed area 130 is 0° (that is to say, the axial direction of the hemisphere cylindrical lens 110 is parallel to that of the depressed area 130).

Referring to FIG. 1C, the depressed area 130 comprises a depressed point 130a, a first inclined plane 130b, and a second inclined plane 130c. The first inclined plane 130b and the second inclined plane 130c are respectively located on the different sides of the depressed point 130a. They are respectively connected between the depressed point 130a and the adjacent connection area 132. The first inclined plane 130b faces the first side surface 12. Thus, the shape of the depressed area 130 is substantially of an upside-down V-Cut, which has the depressed point 130a and the two nearby slopes (the first inclined plane 130b and the second inclined plane 130c). The depressed point 130a forms a perpendicular line perpendicular to the connection area 132. The included angle (namely, the first included angle) between the first inclined plane 130b and the perpendicular line of the connection area 132 is $\theta_1$. The included angle (namely, the second included angle) between the second inclined plane 130c and the perpendicular line of the connection area 132 is $\theta_2$. The lengths between the perpendicular line and the adjacent connection area 132 of the inclined planes 130b and 130c to the extension of the connection area 132 are $d_1$ and $d_2$, respectively.

According to the first embodiment of the present disclosure, both of the included angles $\theta_1$ and $\theta_2$ are between 15° and 60°. The length W of the lower plane surface 110b of the lens 110 is greater than or equal to twice the sum of the lengths $d_1$ and $d_2$, that is, $W \geq 2(d_1+d_2)$.

After being focused by the lens array plate 1100, the sunlight 180 is reflected twice by the depressed area 130 and the connection area 132 in sequence. Then the sunlight 180 is guided into the light guide plate 120 by the total internal reflection. Finally, the sunlight 180 passes through the first side surface 12 of the light guide plate 120. The energy conversion device 140 is disposed on or near the first side surface 12 to receive the sunlight 180 and convert the sunlight 180 into the electric power. Specifically, referring to FIGS. 1B and 1C, the focus of the sunlight 180 passing through the lens 110 is located above the first inclined plane 130b. After the sunlight 180 passes through the lens array plate 1100 and is focused by the lens array plate 1100, the focus of the focused sunlight 180 is disposed above the first inclined plane 130b. Afterwards, the focused sunlight 180 is projected onto the first inclined plane 130b of the depressed area 130, and then, is reflected by the first inclined plane 130b (thus forming a first reflection) onto an adjacent connection area 132. In this embodiment, although the focus of the lens array plate 1100 is located above the first inclined plane 130b, the focus of the lens array plate 1100 may also be located at the first inclined plane 130b or below the first inclined plane 130b. The present disclosure is not limited thereto.

Then, the sunlight 180 is reflected by the connection area 132 (thus forming a secondary reflection), so that the sunlight 180 is deflected by a larger angle. Then, the sunlight 180 is reflected between the upper plane surface 120a and the lower microstructure surface 120b of the light guide plate 120 by the total internal reflection, so that the sunlight 180 is guided towards the first side surface 12 of the light guide plate 120. Thus, the sunlight 180 finally passes through the first side surface 12 of the light guide plate 120. The energy conversion device 140 disposed on or near the first side surface 12 can receive the sunlight 180 passing through the first side surface 12, and convert the sunlight 180 into the electric power accordingly. The refractive index of the light guide plate 120 is denoted as $n_c$. When the sunlight 180 is incident upon the connection area 132 to be reflected for the second time (the second reflection), the incident angle of the sunlight 180 must be greater than a critical angle (that is, $\sin^{-1} 1/n_c$) between the light guide plate 120 and air, which is sufficient for the light to be totally reflected, and be reflected back and forth in the light guide plate 120.

In the focusing solar light guide module according to the first embodiment of the present disclosure, the thickness h of the light guide plate 120 and the length W of the lower plane surface 110b of the lens 110 have a relationship of $h \geq W$. In addition, if the lens array plate 1100 comprises N lenses 110, h, W, and N have a relationship of $N \times W \leq 50 \times h$. For example, N, W, and h are designed as 70, 3 mm, and 10 mm, respectively.

In order that the sunlight 180 can be guided into the light guide plate 120, the refractive index $n_1$ of the lens array plate 1100 is less than the refractive index $n_c$ of the light guide plate 120.

Second Embodiment

Figure 1D:
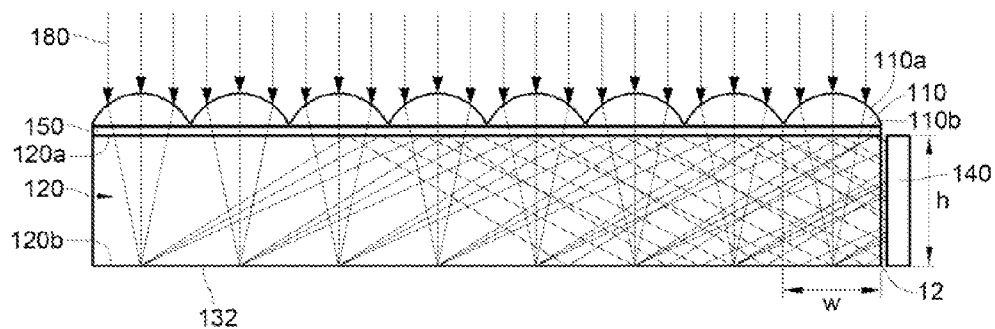
FIG. 1D is a schematic view of a focusing solar light guide module according to a second embodiment.

FIG. 1D is a schematic view of a focusing solar light guide module according to the second embodiment of the present disclosure. The focusing solar light guide module comprises a lens array plate 1100, a light guide plate 120, and an interface layer 150. The interface layer 150 is disposed between the lens array plate 1100 (lens 110) and the light guide plate 120. In order that the sunlight 180 can be guided into the light guide plate, the refractive index $n_I$ of the interface layer 150 is less than the refractive index $n_c$ of the light guide plate 120, and the refractive index $n_I$ of the interface layer 150 is also less than the refractive index $n_1$ of the lens array plate 1100.

Third Embodiment

Figure 2A:
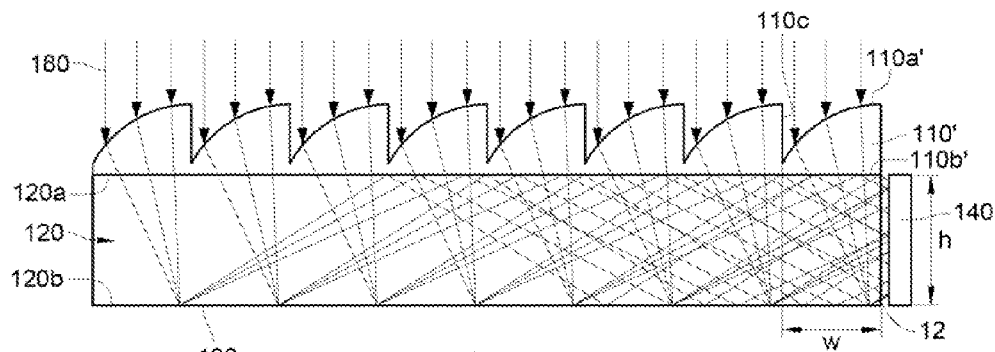
FIG. 2A is a structural side view of a focusing solar light guide module according to a third embodiment.

FIG. 2A is a side view of a focusing solar light guide module according to the third embodiment of the present disclosure. In order to increase intensity of guided light, each lens 110' has a curved sawtooth cross-section profile, and the lens 110' comprises an upper curved surface 110a', a lower plane surface 110b', and a connection surface 110c. The connection surface 110c connects two upper curved surfaces 110a' adjacent to each other. In this embodiment, the upper curved surface 110a' faces the direction corresponding to the first side surface 12, so that when entering the lens 110', the sunlight 180 is focused on a light guide plate 120 and deflected to a direction inclined to the first side surface 12 from a center of the upper curved surface 110a'. Thus, the focused sunlight 180 passing through the lens 110' is incident to the first inclined plane 130b with a larger incident angle, and the intensity of the light reflected by the first inclined plane 130b is increased. In this embodiment, the connection surface 110c is a perpendicular surface, but in other embodiments the connection surface 110c may also be a slope. The present disclosure is not limited thereto.

Fourth Embodiment

Figure 2B:
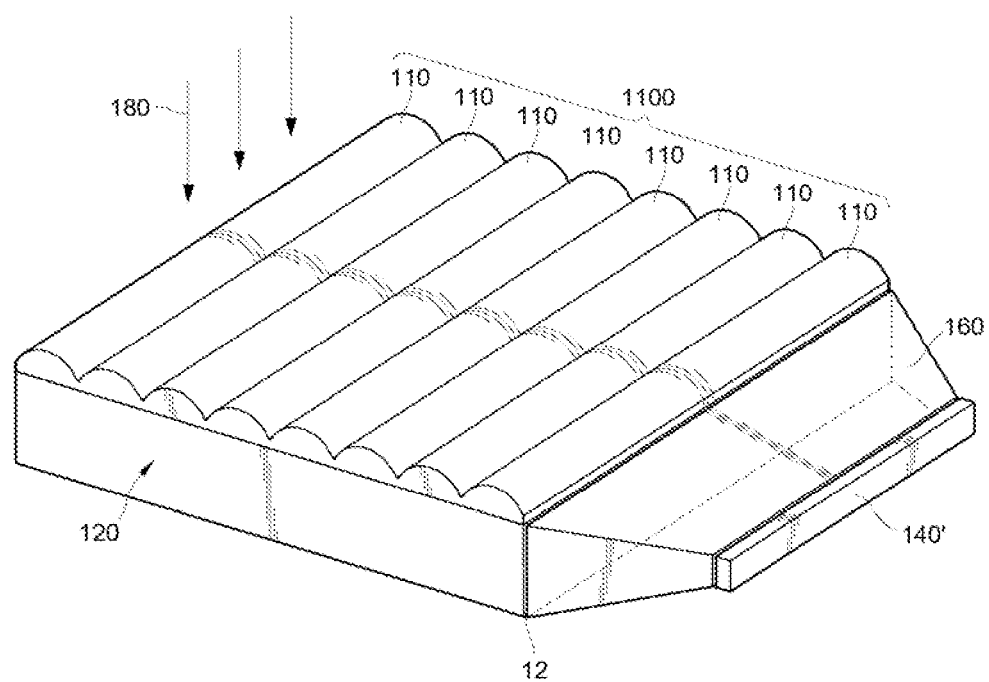
FIG. 2B is a schematic view of a focusing solar light guide module according to a fourth embodiment.

FIG. 2B is a schematic view of a focusing solar light guide module according to a fourth embodiment of the present disclosure. Besides a lens array plate 1100 and a light guide plate 120, the focusing solar light guide module further comprises a condensing lens 160. In the focusing solar light guide module according to the fourth embodiment of the present disclosure, the condensing lens 160 is disposed between the first side surface 12 and the energy conversion device 140', so that before entering the energy conversion device 140', sunlight 180 firstly passes through the condensing lens 160, so as to further narrow the condensing range of the sunlight 180 passing through the light guide plate 120, thus saving a use and an occupied area of the energy conversion device 140' to achieve downsized design.

Fifth Embodiment

Figure 3A:
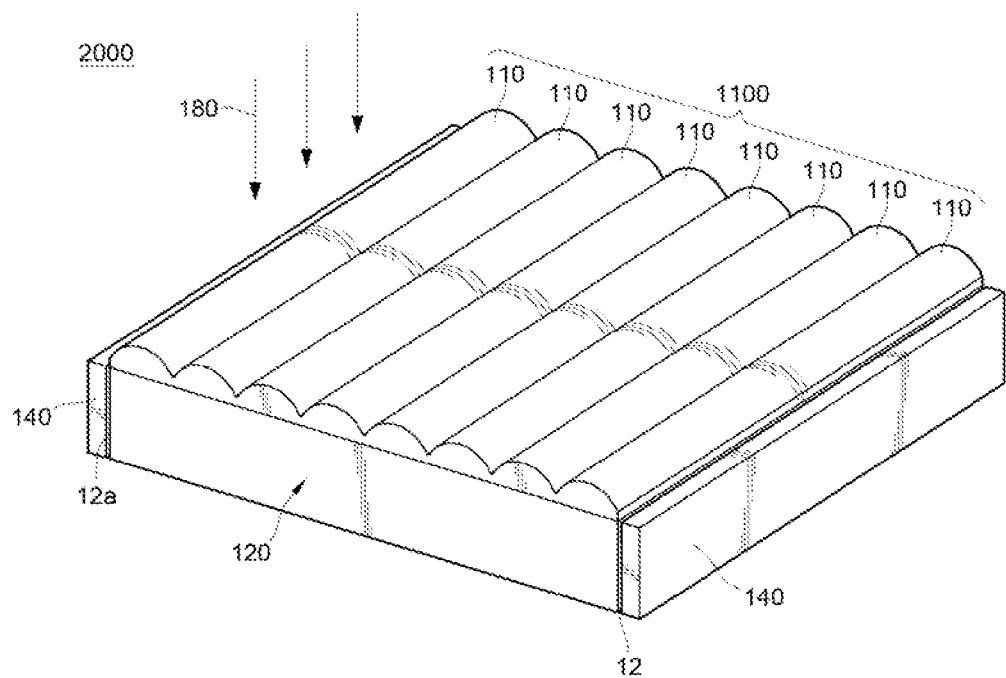
FIG. 3A is a schematic view of a focusing solar light guide module according to a fifth embodiment.
Figure 3B:
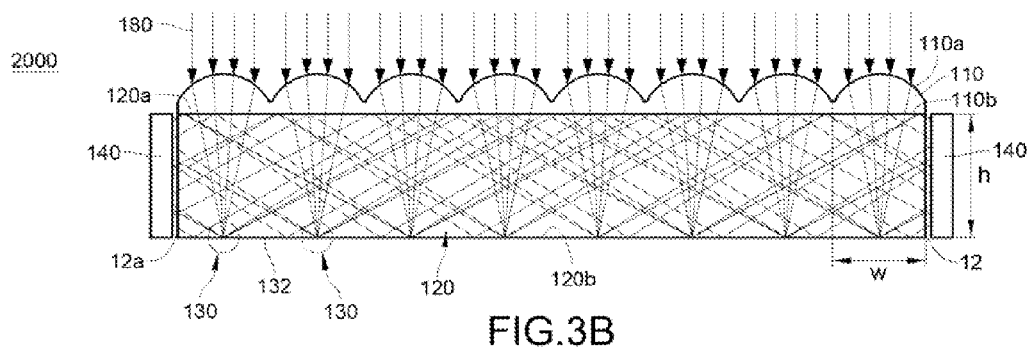
FIG. 3B is a side view according to FIG. 3A.
Figure 3C:
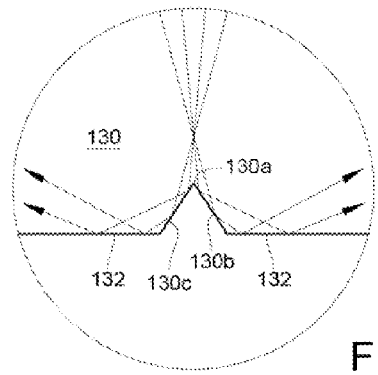
FIG. 3C is a partially enlarged view according to FIG. 3B.

FIG. 3A is a schematic view of a focusing solar light guide module according to a fifth embodiment of the present disclosure and FIG. 3B is a side view according to FIG. 3A. FIG. 3C is a partially enlarged view according to FIG. 3B. Refer to FIGS. 3A to 3C for the following descriptions.

A focusing solar light guide module 2000 comprises a lens array plate 1100 and a light guide plate 120. The light guide plate 120 has two different side surfaces, the first side surface 12 and the second side surface 12a, and each of them has an energy conversion device 140 disposed on or near it. The focusing solar light guide module 2000 is suitable to guide the sunlight 180 to the energy conversion devices 140 for photoelectric or thermoelectric conversion, and the sunlight 180 is regarded as ideal parallel light.

The lens array plate 1100 receives and focuses the sunlight 180. The lens array plate 1100 comprises at least one lens 110, a light guide plate 120 with an upper plane surface 120a and a lower microstructure surface 120b. The configurations of all the elements and the design of the microstructure are the same as those in the first embodiment of the present disclosure, and are therefore not repeated herein. In the focusing solar light guide module according to the fifth embodiment of the present disclosure as shown in FIG. 3C, the focus of the sunlight 180 passing through the lens 110 is located above the depressed point 130a. Specifically, after the sunlight 180 is focused by the lens array plate 1100, the focus of the sunlight 180 is located above the depressed point 130a. Then the focused sunlight 180 is reflected by the first inclined plane 130b and the second inclined plane 130c to the different sides of the depressed point 130a. In this embodiment, the focus of the lens array plate 1100 is located above the depressed point 130a, the focus of the lens array plate 1100 may also be located at the depressed point 130a or below the depressed point 130a. The present disclosure is not limited thereto.

Then, the sunlight 180 is reflected by the connection area 132, so that the light is deflected by a larger angle. The sunlight 180 is totally internal reflected between the upper plane surface 120a and the lower microstructure surface 120b of the light guide plate 120. Thus, the sunlight 180 is guided towards both the first side surface 12 and the second side surface 12a of the light guide plate 120. Thus, the sunlight 180 finally travels towards the two different sides of the depressed point 130a, and passes through the first side surface 12 and the second side surface 12a of the light guide plate 120. The first inclined plane 130b faces the first side surface 12, and the second inclined plane 130c faces the second side surface 12a. Finally, the energy conversion devices 140 disposed on or near the first side surface 12 and the second side surface 12a can receive the sunlight 180 passing through the light guide plate 120, and convert the sunlight 180 into the electric power accordingly.

Sixth Embodiment

Figure 4A:
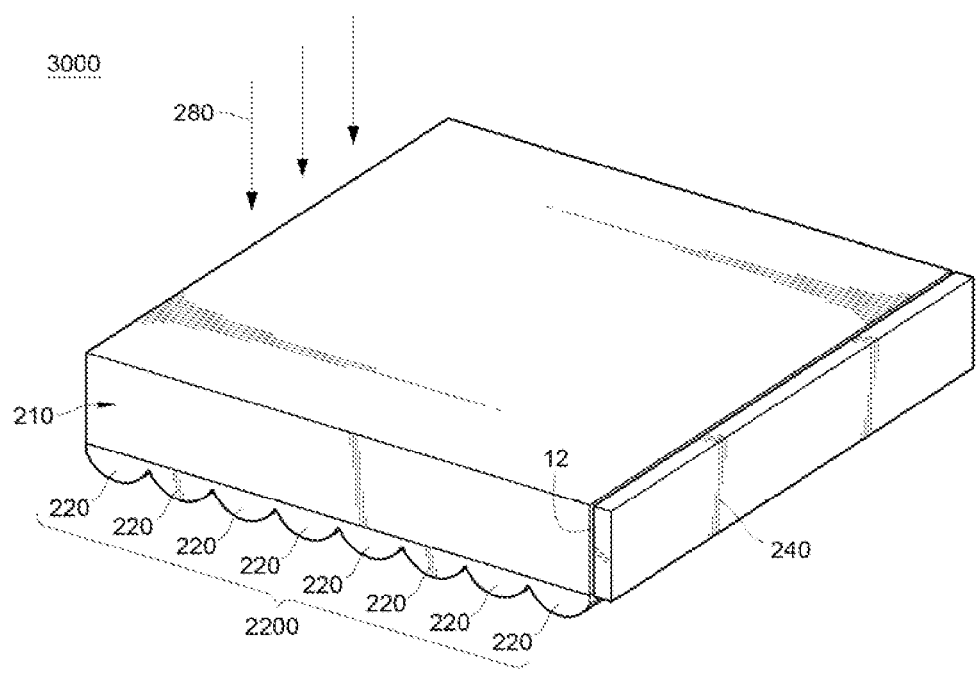
FIG. 4A is a schematic view of a focusing solar light guide module according to a sixth embodiment.
Figure 4B:
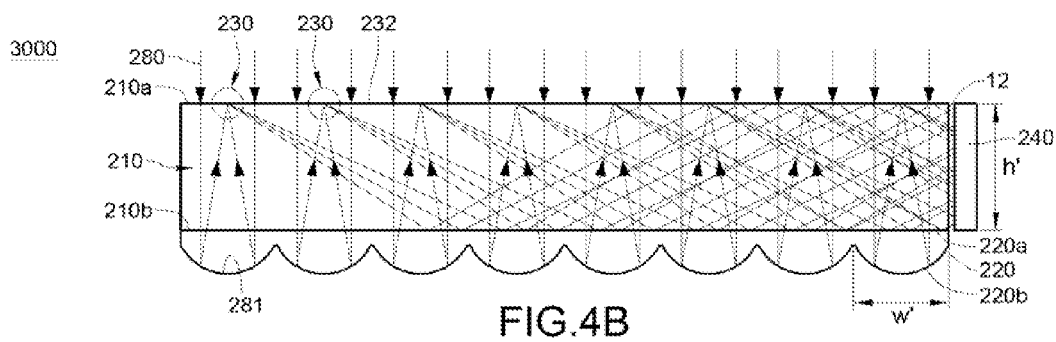
FIG. 4B is a side view according to FIG. 4A.
Figure 4C:
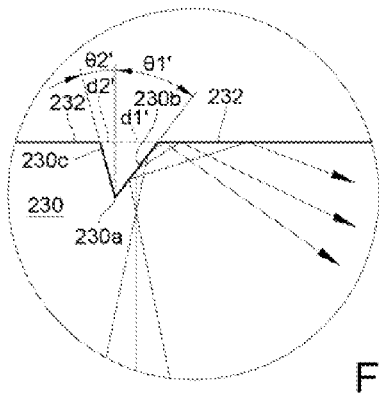
FIG. 4C is a partially enlarged view according to FIG. 4B.

FIG. 4A is a schematic view of a focusing solar light guide module according to the sixth embodiment of the present disclosure. FIG. 4B is a side view according to FIG. 4A. FIG. 4C is a partially enlarged view according to FIG. 4B. Refer to FIGS. 4A to 4C for the following descriptions.

A focusing solar light guide module 3000 comprises a light guide plate 210 and a lens array plate 2200. An energy conversion device 240 is disposed on or near the first side surface 12 of the light guide plate 210. The energy conversion device 240 may be, but not limited to, a photoelectric conversion device or a thermoelectric conversion device. The focusing solar light guide module 3000 is suitable to guide the sunlight 280 to the energy conversion device 240 for photoelectric or thermoelectric conversion, and the sunlight 280 is regarded as ideal parallel light.

The light guide plate 210 has an upper microstructure surface 210a and a lower plane surface 210b. The thickness h' of the light guide plate 210 is the distance between the upper microstructure surface 210a and the lower plane surface 210b. The upper microstructure surface 210a comprises at least one depressed area 230 and at least one connection area 232. The connection area 232 is parallel to the lower plane surface 210b of the light guide plate 210, and the connection area 232 is connected between the depressed areas 230 adjacent to each other. That is to say, in the focusing solar light guide module according to the sixth embodiment of the present disclosure, the depressed areas 230 are separated from each other (that is, discontinuous), and are disposed on the upper microstructure surface 210a. Every two depressed areas 230 are separated from each other by the connection area 232. Thus, the upper microstructure surface 210a of the light guide plate 210 has the discontinuous depressed areas 230.

Referring to FIG. 4C, the depressed area 230 comprises the depressed point 230a, the first inclined plane 230b, and the second inclined plane 230c. The first inclined plane 230b and the second inclined plane 230c are respectively located on the different sides of the depressed point 230a. They are respectively connected between the depressed point 230a and the adjacent connection area 232 thereof. The first inclined plane 230b faces the first side surface 12. Thus, the shape of the depressed area 230 is substantially of V-Cut, which has the depressed point 230a and the two nearby slopes (the first inclined plane 230b and the second inclined plane 230c). The depressed point 230a forms a perpendicular line perpendicular to the connection area 232. The included angle (namely, the first included angle) between the first inclined plane 230b and the perpendicular line of the connection area 232 is $\theta_1'$. The included angle (namely, the second included angle) between the second inclined plane 230c and the perpendicular line of the connection area 232 is $\theta_2'$. The lengths between the perpendicular line and the adjacent connection area 232 of the inclined planes 230b and 230c to the extension of the connection area 232 are $d_1'$ and $d_2'$, respectively.

According to the sixth embodiment of the present disclosure, both of the included angles $\theta_1'$ and $\theta_2'$ are between 15° and 60°. The length W' of the upper plane surface 220a of the lens 220 is greater than or equal to twice the sum of the lengths $d_1'$ and $d_2'$, that is, W'≥2($d_1'$+$d_2'$).

Referring to FIGS. 4A and 4B, the lens array plate 2200 comprises at least one lens 220, and each of the lenses 220 has an upper plane surface 220a and a lower curved surface 220b. For example, the lens array plate 2200 may be, but not limited to, a lenticular lens array film made by using a Roll-to-Roll (R2R) process. The length of the upper plane surface 220a of the single lens 220 is W'. In one embodiment, each of the lenses 220 is a hemisphere cylindrical lens. The upper plane surfaces 220a are connected to each other and the lower curved surfaces 220b are connected to each other. The lenses 220 are aligned in parallel to form the lens array plate 2200.

The lower curved surface 220b is covered with a reflective layer 281. Then the sunlight 280 can be reflected and focused to the light guide plate 210 by the reflective layer 281. The reflective layer 281 may be made of a reflective material, such as the metal, the total reflection multilayer, the white reflector, etc.

The upper plane surface 220a of the lens 220 is configured to be parallel to the lower plane surface 210b of the light guide plate 210. In the focusing solar light guide module according to the sixth embodiment of the present disclosure, the following description is based on that the upper plane surface 220a of the lens 220 is parallel to, and in tight contact with the lower plane surface 210b of the light guide plate 210. However, the upper plane surface 220a of the lens 220 may also be a fixed gap away from, and parallel to the lower plane surface 210b of the light guide plate 210. A connection relation between the upper plane surface 220a of the lens 220 and the lower plane surface 210b of the light guide plate 210 is not intended to limit the scope of the present disclosure.

After passing through the light guide plate 210, the sunlight 280 is reflected and focused by the lower curved surface 220b of the lens 220 of the lens array plate 2200 to the upper microstructure surface 210a of the light guide plate 210. Then the sunlight 280 is reflected twice by the depressed area 230 and the connection area 232 in sequence, and is guided into the light guide plate 210 by the total internal reflection. Finally, the sunlight 280 passes through the first side surface 12 of the light guide plate 210. The energy conversion device 240 is disposed on or near the first side surface 12 to receive the sunlight 280, and convert the sunlight 280 into the electric power. Specifically, referring to FIGS. 4B and 4C, the focus of the sunlight 280 reflected and focused by the lens 220 is located below the first inclined plane 230b. After the sunlight 280 passes through the light guide plate 210, and enters the lens array plate 2200, the sunlight 280 is reflected by the lower curved surface 220b plated with the reflective layer 281, and then, is focused below the first inclined plane 230b of the depressed area 230. Next, the focused sunlight 280 is firstly projected onto the first inclined plane 230b of the depressed area 230, and is reflected by the first inclined plane 230b (thus, forming the first reflection) onto the adjacent connection area 232. In this embodiment, although the focus of the lens array plate 2200 is located below the first inclined plane 230b, the focus of the lens array plate 2200 may also be located at the first inclined plane 230b or above the first inclined plane 230b. The present disclosure is not limited thereto.

Then, the sunlight 280 is reflected by the connection area 232 (thus forming the secondary reflection), so that the sunlight 280 is deflected by a larger angle. Then, the sunlight 280 is reflected between the upper microstructure surface 210a and the lower plane surface 210b of the light guide plate 210, so that the sunlight 280 is guided towards the first side surface 12 of the light guide plate 210. Thus, the sunlight 280 finally passes through the first side surface 12 of the light guide plate 210. The energy conversion device 240 disposed on or near the first side surface 12 can receive the sunlight 280 passing through the first side surface 12, and convert the sunlight 280 into the electric power accordingly. The refractive index of the light guide plate 210 is denoted as $n_c'$. When the sunlight 280 is incident upon the connection area 232 to be reflected for the second time (the second reflection), the incident angle of the sunlight 280 must be greater than a critical angle $$\left(\text{that is, } \sin^{-1}\frac{1}{n_c'}\right)$$

between the light guide plate 210 and air, which is sufficient for the light to be totally reflected, and be reflected back and forth in the light guide plate 210.

In the focusing solar light guide module according to the sixth embodiment of the present disclosure, the thickness h' of the light guide plate 210 and the length W' of the upper plane surface 220a of the lens 220 have a relationship of h'≥W'. In addition, if the lens array plate 2200 comprises N lenses 220, h', W', and N have a relationship of, N×W'≤50×h'. For example, N', W', and h' are designed as 70, 3 mm, and 10 mm, respectively.

In order that the sunlight 280 can be guided into the light guide plate 210, the refractive index $n_1'$ of the lens array plate 2200 is less than the refractive index $n_c'$ of the light guide plate 210.

Seventh Embodiment

Figure 4D:
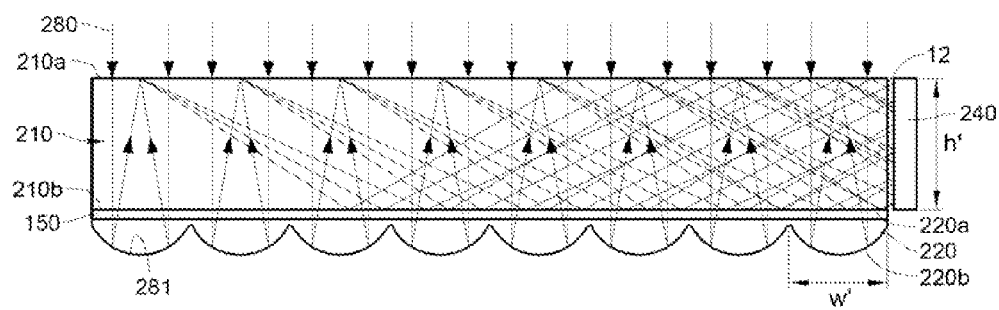
FIG. 4D is a schematic view of a focusing solar light guide module according to a seventh embodiment.

FIG. 4D is a schematic view of a focusing solar light guide module according to the seventh embodiment of the present disclosure. The focusing solar light guide module comprises a light guide plate 210, a lens array plate 2200, and an interface layer 150. The interface layer 150 is disposed between the light guide plate 210 and the lens array plate 2200 (lens 220). In order that the sunlight 280 can be guided into the light guide plate 210, the refractive index $n_i'$ of the interface layer 150 is less than the refractive index $n_c'$ of the light guide plate 210, and the refractive index $n_i'$ of the interface layer 150 is also less than the refractive index $n_1'$ of the lens array plate 2200.

Eighth Embodiment

Figure 5A:
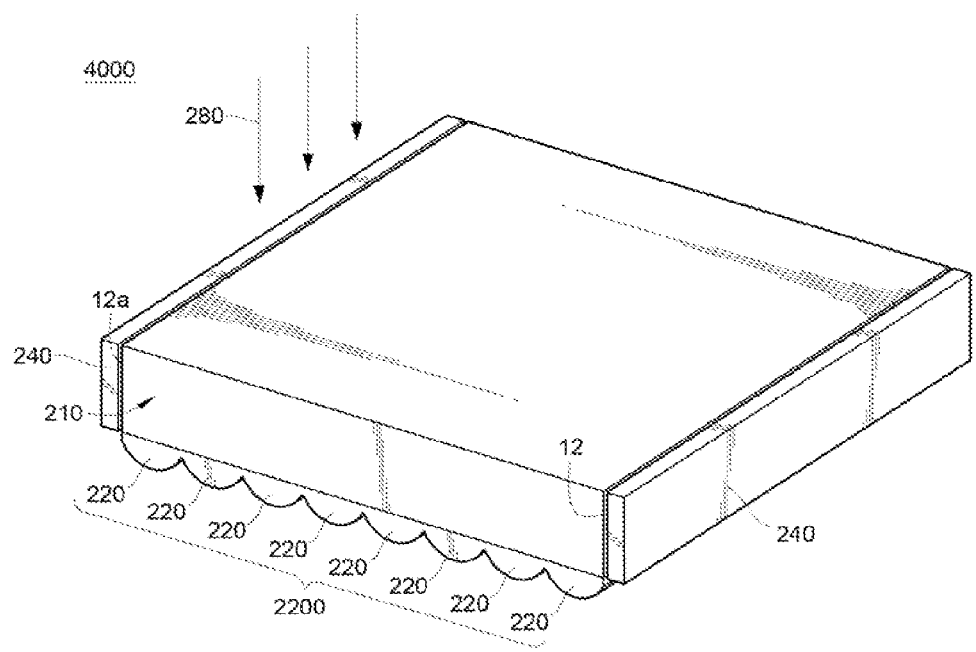
FIG. 5A is a schematic view of a focusing solar light guide module according to an eighth embodiment.
Figure 5B:
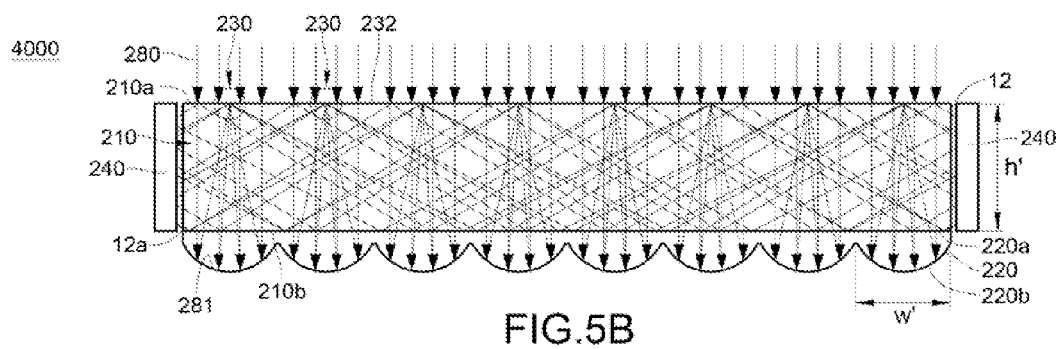
FIG. 5B is a side view according to FIG. 5A.
Figure 5C:
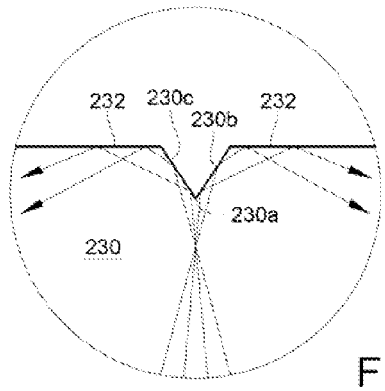
FIG. 5C is a partially enlarged view according to FIG. 5B.

FIG. 5A is a schematic view of a focusing solar light guide module according to an eighth embodiment of the present disclosure. FIG. 5B is a side view according to FIG. 5A. FIG. 5C is a partially enlarged view according to FIG. 5B. Refer to FIGS. 5A to 5C for the following descriptions.

A focusing solar light guide module 4000 comprises a light guide plate 210 and a lens array plate 2200. The light guide plate 210 has two different side surfaces, a first side surface 12 and a second side surface 12*a*, and each of them has an energy conversion device 240 disposed on or near it. The focusing solar light guide module 4000 is suitable to guide sunlight 280 to the energy conversion devices 240 for photoelectric or thermoelectric conversion, and the sunlight 280 is regarded as ideal parallel light.

The lens array plate 2200 comprises at least one lens 220, a light guide plate 210 with an upper microstructure surface 210*a* and a lower plane surface 210*b*. The configurations of all the elements and the design of the microstructure are the same as those in the sixth embodiment of the present disclosure, and are therefore not repeated herein. In the focusing solar light guide module according to the eighth embodiment of the present disclosure as shown in FIG. 5C, the focus of the sunlight 280 reflected and focused by the lens array plate 2200 is located below the depressed point 230*a*. The focus of the sunlight 280 reflected and focused by the reflective layer 281 is disposed below the depressed point 230*a*. Therefore, the focused sunlight 280 travels towards slopes of two different sides of the depressed point 230*a* respectively, is therein projected onto the first inclined plane 230*b* and the second inclined plane 230*c* of the depressed area 230, and is reflected onto an adjacent connection area 232 thereof respectively by the first inclined plane 230*b* and the second inclined plane 230*c*. In this embodiment, the focus of the lens array plate 2200 is located below the depressed point 230*a*, the focus of the lens array plate 2200 may also be located at the depressed point 230*a* or above the depressed point 230*a*. The present disclosure is not limited thereto.

Then, the sunlight 280 is reflected by the connection area 232, so that the light is deflected by a larger angle. The sunlight 280 is totally internal reflected between the upper microstructure surface 210*a* and the lower plane surface 210*b* of the light guide plate 210. Thus, the sunlight 280 is guided towards both the first side surface 12 and the second side surface 12*a* of the light guide plate 210. The sunlight 280 passes through the first side surface 12 and the second side surface 12*a* of the light guide plate 210. The first inclined plane 230*b* faces the first side surface 12, and the second inclined plane 230*c* faces the second side surface 12*a*. Finally, the energy conversion devices 240 disposed on of near the first side surface 12 and the second side surface 12*a* can receive the sunlight 280 passing through the light guide plate 210, and convert the sunlight 280 into the electric power accordingly.

Ninth Embodiment

Figure 6A:
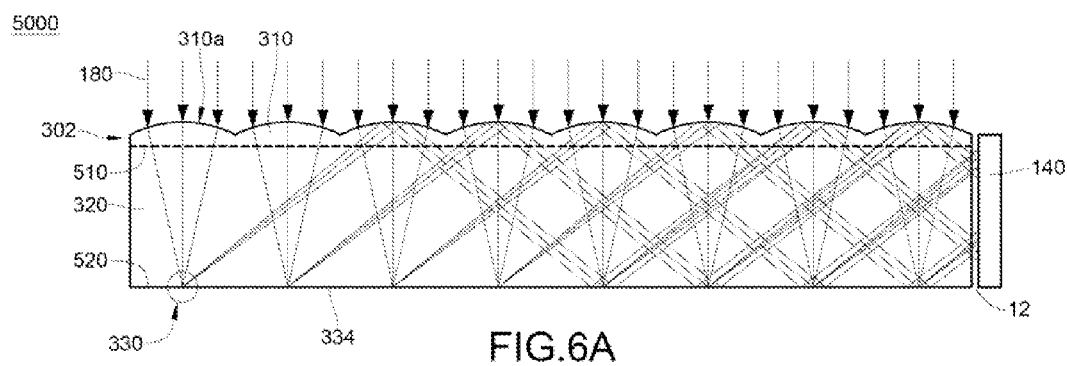
FIG. 6A is a schematic view of a focusing solar light guide module according to a ninth embodiment.

FIG. 6A is a schematic view of a focusing solar light guide module according to a ninth embodiment. Please refer to FIG. 1B and FIG. 6A together for the following descriptions.

The structure of a focusing solar light guide module 5000 is similar to that of the focusing solar light guide module 1000. The difference between the focusing solar light guide module 5000 and the focusing solar light guide module 1000 is that the lens array plate 1100 and the light guide plate 120 of the focusing solar light guide module 1000 are integrated into one piece in FIG. 6A, that is, so-called lens light guide plate. Therefore, the focusing solar light guide module 5000 comprises a lens light guide plate 320. The lens light guide plate 320 has a lens array 302 and multiple microstructures 330. The lens array 302 and the microstructures 330 are disposed on two different and opposite surfaces of the lens light guide plate 320. In this embodiment, the lens array 302 is disposed on an upper surface 510 of the lens light guide plate 320, and the microstructures 330 are disposed on a lower surface 520 of the lens light guide plate 320, which the upper surface 510 and the lower surface 520 are opposite to each other.

Figure 6B:
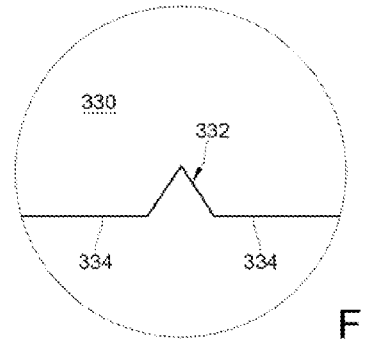
FIG. 6B is a partially enlarged view according to FIG. 6A.

The lens array 302 comprises at least one lens 310. Each of the lenses 310 has a curved surface 310*a*. The lens array 302 receives and focuses the sunlight 180. The microstructures 330 comprise multiple depressed areas 332 and multiple connection areas 334 (referring to FIG. 6B, which is a partially enlarged view of microstructures according to FIG. 6A). The design of the depressed areas 332 and the connection areas 334 are the same as the depressed areas 130 and the connection areas 132 of the lower microstructure surface 120*b* in the first and the fifth embodiments of the disclosure. Therefore, it is not repeated again herein.

Moreover, the relative positions of the depressed areas 332 and a focus of the lens 310 may be the same as shown in FIG. 1C and FIG. 3C. Then the sunlight 180 can be reflected and guided to one or two different side surfaces of the lens light guide plate 320.

Tenth Embodiment

Figure 7A:
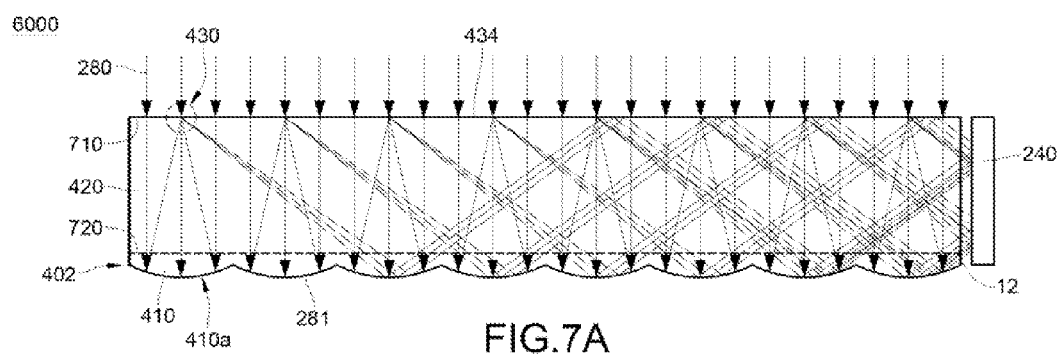
FIG. 7A is a schematic view of a focusing solar light guide module according to a tenth embodiment.

FIG. 7A is a schematic view of a focusing solar light guide module according to a tenth embodiment; Please refer to FIG. 4B and FIG. 7A together for the following descriptions.

The structure of a focusing solar light guide module 6000 is similar to that of the focusing solar light guide module 3000. The difference between the focusing solar light guide module 6000 and the focusing solar light guide module 3000 is that the lens array plate 2200 and the light guide plate 120 of the focusing solar light guide module 3000 are integrated into one piece, that is, so-called lens light guide plate. Therefore, the focusing solar light guide module 6000 comprises a lens light guide plate 420. The lens light guide plate 420 has a lens array 402 and multiple microstructures 430. The lens array 402 and the microstructures 430 are disposed on two different and opposite surfaces of the lens light guide plate 420. In this embodiment, the microstructures 430 are disposed on an upper surface 710 of the lens light guide plate 420, and the lens array 402 is disposed on a lower surface 720 of the lens light guide plate 420, which the upper surface 710 and the lower surface 720 are opposite to each other.

Figure 7B:
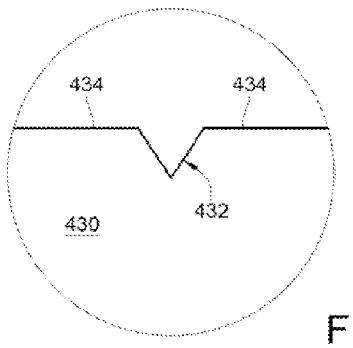
FIG. 7B is a partially enlarged view according to FIG. 7A.

The lens array 402 comprises at least one lens 410. Each of the lenses 410 has a curved surface 410*a*. The lens array 402 receives and focuses the sunlight 280. The curved surface 410*a* is covered with a reflective layer 281. Then the sunlight 280 can be reflected and focused to the microstructures 430 of the lens light guide plate 420 by the reflective layer 281. The microstructures 430 comprise multiple depressed areas 432 and multiple connection areas 434 (referring to FIG. 7B, which is a partially enlarged view of microstructures according to FIG. 7A). The design of the depressed areas 432 and the connection areas 434 are the same as the depressed areas 230 and the connection areas 232 of a upper microstructure surface 210*a* in the sixth and the eighth embodiments of the disclosure. Therefore, it is not repeated again herein.

Moreover, the relative positions of the depressed areas 432 and the focus of the lens 410 may be the same as shown in FIG. 4C and FIG. 5C. Then the sunlight 280 can be reflected and guided to one or two different side surface of the lens light guide plate 420.

In view of the above, in the focusing solar light guide module according to any embodiment of the present disclosure, the lens of the focusing solar light guide module may be replaced with the lens with the curved sawtooth cross-section profile as shown in FIG. 2A to increase the intensity of the guided light. Alternatively, as shown in FIG. 2B, the condensing lens 160 is disposed between the first side surface 12 of the light guide plate and the energy conversion device 140', so as to further narrow the condensing range of the sunlight out of the first side surface 12. Then the occupied area of the energy conversion device 140' can be also further reduced. People skilled in the art may design specifications of the solar light guide module with respect to any embodiment of the present disclosure. The above embodiments are not intended to limit the scope of the present disclosure.

Figure 8A:
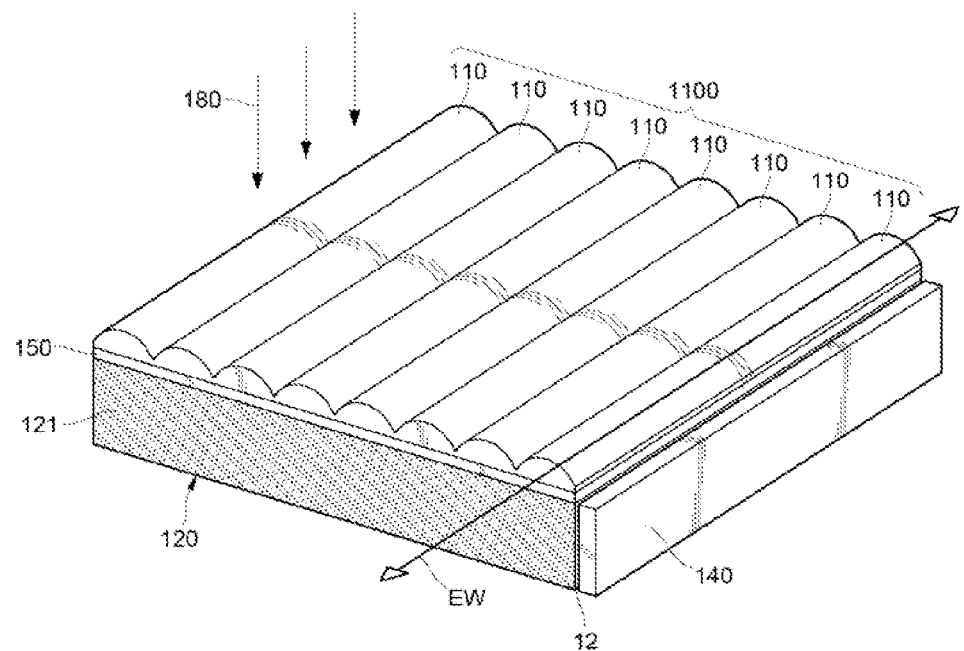
FIG. 8A is a schematic view according to FIG. 1D.
Figure 8B:
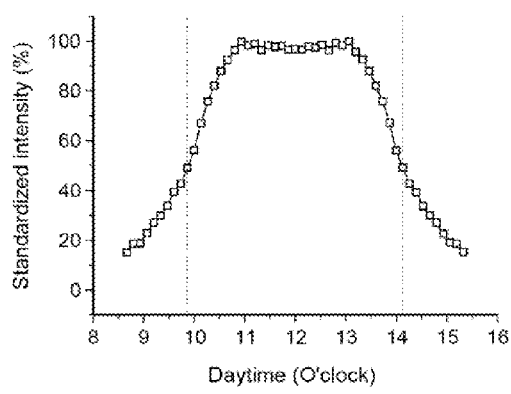
FIG. 8B and FIG. 8C are light guide efficiency standardized intensity charts according to FIG. 8A.
Figure 8C:
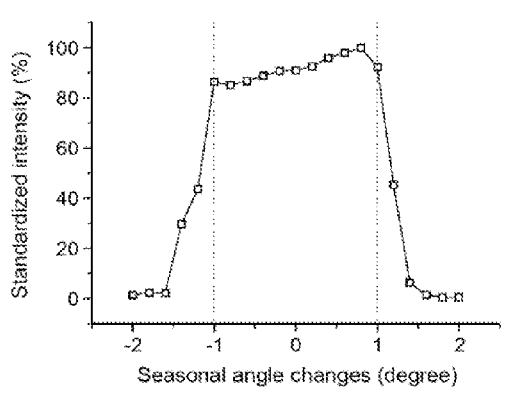

In addition, FIG. 8A is a schematic view according to FIG. 1D. The axial direction of the lenticular lens 110 is configured to be parallel to the east-west direction denoted as the direction EW in which the sun rises and falls. FIGS. 8B and 8C are the simulated results of the normalized efficiency of the light guide according to FIG. 8A. The simulation parameters are as follows:

R (radius of curvature of the lenticular lens)=4.09 mm.
$n_1$=1.56
$n_i$=1.00
$n_c$=1.49
h=10 mm
W=3.46 mm
N×W=210 mm
$\theta_1$=40°
$\theta_2$=20°
$d_1$=0.302 mm
$d_2$=0.131 mm At noon the sunlight 180 is incident to the focusing solar light guide module at a normal angle (i.e. the incident angle is 0°), the simulated efficiency of the light guide of the focusing solar light guide module according to the present disclosure is about 60%.

When the incident angle of the sunlight 180 is between ±30 degrees (that is, 10:00 A.M. to 2:00 P.M. in the daytime), the normalized efficiency of the light guide of the focusing solar light guide module according to the present disclosure can be greater than 55%. Since the axial direction of the lenticular lens 110 is parallel to the east-west direction, and the changes of the incident angle caused by the rising and falling of the sun during a day is not sensitive. Therefore the focusing solar light guide module according to the embodiment may still achieve the relative efficiency of light guide greater than 55% without being equipped with a sun tracking system around noon.

Figure 8D:
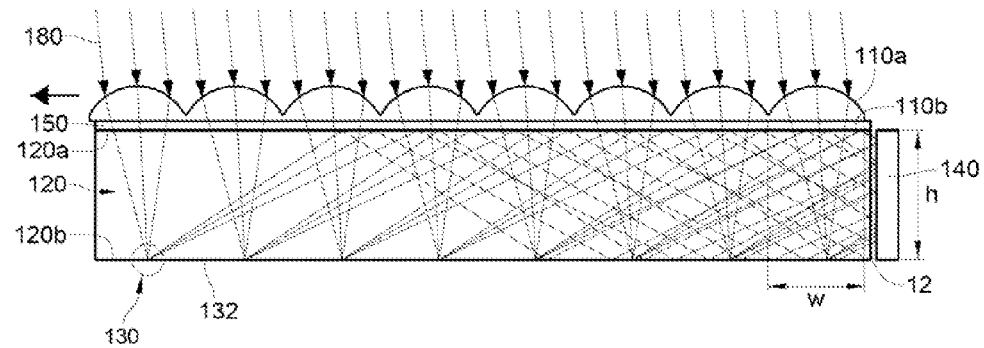
FIG. 8D is a schematic view of a lens to be designed as a movable lens to achieve a light guide effect of seasonal sun tracking according to FIG. 8A.

As shown in FIG. 8C, the seasonal angle changes of the focusing solar light guide module according to the embodiment may be up to ±1 degrees. Therefore, if it is intended to decrease the angle change sensitivity of the light guide module to the seasonal changes, in the focusing solar light guide module according to the embodiment, as shown in FIG. 8D, the lens array plate may also be moved in a south-north direction (that is, the lens array plate is designed to be an array of movable lenses). Because the variance of the seasons changes the incident angle of the sunlight 180, the lens array plate moves in the south-north direction, and the focused sunlight 180 may also fall near the depressed area 130 of the light guide plate 120, thus achieving a light guide effect of seasonal sun tracking.

Moreover, when the axial direction of the lenticular lens 110 is configured to be parallel to the east-west direction denoted as the direction EW as shown in FIG. 8A, the side surfaces of the light guide plate 120 which face the east and west directions can be covered with a reflective layer 121 (such as the metal, the total reflection multilayer, and the white reflector) for solving the problem of the leakage of the light from the surfaces.

In view of the above, in the focusing solar light guide module according to the present disclosure, the incident sunlight can be focused by the lens array plate, reflected by the microstructure on the surface of the light guide plate, and guided into the light guide plate. After passing through the side surface of the light guide plate, the sunlight can be received and converted into the electric power by the energy conversion device disposed on or near the side surface. Therefore, the focusing solar light guide module according to the present disclosure decreases the usage of the solar cell, reduces the module cost, and remains the high efficiency of the light guide without the sun tracking system.

According to the present disclosure as mentioned above, the focusing solar light guide module, comprising a lens array plate and a light guide plate, concentrates the sunlight to small areas by the lens array plate, reflects the sunlight by the microstructures, and then guides the sunlight into the light guide plate by the total internal reflection. For the proposed module, the photoelectric or thermoelectric energy conversion device needs to be disposed at the side surface of the light guide plate, and the sunlight passing through the side surface of the light guide plate can be converted into the electric power. Then the use of the solar cells and the cost of the power generation can be decreased dramatically.

What is claimed is:

1. A focusing solar light guide module, applied to guide sunlight to an energy conversion device, comprising:
   a lens light guide plate, having a lens array and a plurality of microstructures,
   wherein the lens array is integrally formed on a surface of the lens light guide plate and the microstructures are disposed on another opposite surface of the lens light guide plate,
   the lens array comprises a plurality of lenses, each of the plurality of lenses has a curved surface, one of curved surfaces of the plurality of lenses is directly connected to adjacent curved surfaces so that the curved surfaces of the plurality of lenses are continuously arranged to form a curved exterior surface of the lens light guide plate, the lens array receives and focuses the sunlight, some of the sunlight traveling inside of the lens light guide plate is totally internally reflected by at least two lenses of the plurality of lenses after being reflected by the microstructures,
   the microstructures comprise at least one depressed area and at least one connection area, the connection area is connected between the depressed areas, the depressed area comprises a depressed point, a first inclined plane and a second inclined plane, wherein the first inclined plane and the second inclined plane are respectively located on the different sides of the depressed point, the first inclined plane and the second inclined plane are respectively connected between the depressed point and the connection area adjacent to the depressed point,
   after being focused by the lens light guide plate, the sunlight is reflected by the depressed area and then reflected by the connection area in sequence and is guided into the lens light guide plate by the total internal reflection, and the sunlight passes through at least one side surface of the lens light guide plate, and the energy conversion device disposed on or near the side surface of the lens light guide plate receives the sunlight passing through the lens light guide plate and converts the sunlight into an electric power.

2. The focusing solar light guide module according to claim 1, wherein the curved exterior surface of the lens light guide plate is covered with a reflective layer.

* * * * *